(12) United States Patent
Hashimoto

(10) Patent No.: US 7,019,373 B2
(45) Date of Patent: Mar. 28, 2006

(54) PHOTOELECTRIC CONVERSION DEVICE AND MANUFACTURING METHOD THEREOF

(75) Inventor: Sakae Hashimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/855,326

(22) Filed: May 28, 2004

(65) Prior Publication Data
US 2004/0238908 A1   Dec. 2, 2004

(30) Foreign Application Priority Data
May 28, 2003  (JP)  ............... 2003-150604
May 19, 2004  (JP)  ............... 2004-148986

(51) Int. Cl.
*H01L 31/0232* (2006.01)
*H01L 27/14* (2006.01)

(52) U.S. Cl. ...................... 257/432; 257/431

(58) Field of Classification Search ........ 257/431–434, 257/436, 53, 225
See application file for complete search history.

(56) References Cited

U.S. PATENT DOCUMENTS

| | | | |
|---|---|---|---|
| 4,731,665 A | 3/1988 | Hashimoto et al. | 358/213.27 |
| 4,816,910 A | 3/1989 | Hashimoto et al. | 358/213.27 |
| 4,959,723 A | 9/1990 | Hashimoto | 358/213.11 |
| 4,962,412 A | 10/1990 | Shinohara et al. | 357/30 |
| 5,051,831 A | 9/1991 | Hashimoto | 358/213.11 |
| 5,146,339 A | 9/1992 | Shinohara et al. | 358/212 |
| 5,283,428 A | 2/1994 | Morishita et al. | 250/214.1 |
| 6,171,885 B1 | 1/2001 | Fan et al. | 438/70 |
| 6,221,687 B1 | 4/2001 | Abramovich | 438/70 |
| 6,274,917 B1 | 8/2001 | Fan et al. | 257/432 |
| 6,362,498 B1 | 3/2002 | Abramovich | 257/233 |
| 6,821,810 B1 * | 11/2004 | Hsiao et al. | 438/69 |

FOREIGN PATENT DOCUMENTS

| | | |
|---|---|---|
| JP | 05-335533 | 12/1993 |
| JP | 10-107238 | 4/1998 |
| JP | 10-229180 | 8/1998 |
| JP | 11-040787 | 2/1999 |

* cited by examiner

*Primary Examiner*—Douglas W Owens
(74) *Attorney, Agent, or Firm*—Fitzpatrick, Cella, Harper & Scinto

(57) ABSTRACT

A photoelectric conversion device is provided which is capable of improving the light condensation efficiency without substantially decreasing the sensitivity. The photoelectric conversion device has a first pattern provided above an element isolation region formed between adjacent two photoelectric conversion elements, a second pattern provided above the element isolation region and above the first pattern, and microlenses provided above the photoelectric conversion elements with the first and the second patterns provided therebetween. The photoelectric conversion device further has convex-shaped interlayer lenses in optical paths between the photoelectric conversion elements and the microlenses, the peak of each convex shape projecting in the direction from the electro-optical element to the microlens.

10 Claims, 13 Drawing Sheets

PHOTOELECTRIC CONVERSION DEVICE AND MANUFACTURING METHOD THEREOF

BACKGROUND OF THE INVENTION

1. Field of the Invention

The present invention relates to photoelectric conversion devices and manufacturing methods thereof, the devices used for image input apparatuses such as digital cameras, video cameras, and image readers.

2. Description of the Related Art

In recent years, photoelectric conversion devices have been incorporated in image input apparatuses such as digital cameras, video cameras, and image readers. These photoelectric conversion devices include, for example, CCD image sensors and non-CCD image sensors, such as bipolar transistor image sensors, field effect transistor image sensor, and CMOS image sensors. In such photoelectric conversion devices, optical image information is converted into electrical signals, which are processed using various types of signal processing and displayed in a display device or recorded on a recording medium.

In order to obtain a high performance photoelectric conversion device, the area (pixel area) of a light-receiving surface of a photoelectric conversion element, which area is a light-receiving portion actually performing photoelectric conversion, should be decreased so that the number of photoelectric conversion elements is increased, and in addition, so that the chip size of the photoelectric conversion device is decreased.

As progress toward higher pixel density and reduction in chip size advances, the amount of light received by each photoelectric conversion element forming a pixel decreases as the area of the light-receiving surface is decreased, and as a result, the sensitivity of the device is degraded. In order to suppress this degradation in sensitivity, there is a well known technique in which microlenses are formed on a planarized surface of a protective film provided on the light-receiving surface, so that light is concentrated thereon.

For example, in Japanese Patent Laid-Open No. 10-107238, a manufacturing method of a solid-state image sensing device has been disclosed in which an on-chip lens is formed using an etch-back technique. In this manufacturing method, as shown in FIGS. 10A and 10B, first, a planarizing film 104 is formed on sensor portions 101 and a pad portion 102, and above the sensor portions 101 and the pad portion 102, color filters 103 are formed with the planarizing film 104 positioned therebetween. Subsequently, after a lens material 105 is applied, a lens pattern 106 is formed by patterning through a photolithographic and a thermal treatment step. Next, the entire surface is etch-backed by an etch-back amount 107, thereby forming an on-chip lens 108, as shown in FIG. 10B.

Using this manufacturing method, the formation of the on-chip lens 108 and the formation of an opening above the pad portion 102 can be simultaneously performed. In addition, when the difference between the amount removed by etching for the on-chip lens 108 and the amount removed for the opening above the pad portion 102 is decreased, damage done to the pad portion 102 can be reduced.

Concomitant with the trend toward higher pixel density and reduction in chip size, it has been increasingly required to provide interlayer lenses formed of a film having a refractive index different from that of an adjacent layer. For example, in Japanese Patent Laid-Open No. 2001-94086, a photoelectric conversion device has been disclosed in which light condensation efficiency can be improved even when the light-receiving surface is more finely formed and/or a great number of various films, such as a light shielding pattern and a wire pattern, are formed on the light-receiving surface.

As shown in FIG. 11, this photoelectric conversion device has a first wire pattern 203 having wires positioned above the element isolation region 202 located between adjacent photoelectric conversion elements 201, a first insulating film 204 covering the first wire pattern 203, a second wire pattern 205 provided on the first insulating film 204 and having wires positioned above the element isolation region 202, a second insulating film 206 covering the second wire pattern 205, and microlenses 207 provided on the second insulating film 206. The insulating layers 204 and 206 are applied in two steps. First, a layer of predetermined thickness is applied over the wire pattern (203 and 205, respectively) to form concave portions in the areas between the wires (i.e., the areas over the photoelectric conversion elements 201). Then, an additional layer is applied and made planar on its upper surface to form first and second interlayer lenses 208 and 209 in the optical paths between the microlenses 207 and the light-receiving surfaces of the corresponding photoelectric conversion elements 201. Thus, the step structures provided by the wire patterns 203 and 205 determine, at least in part, the shape of the first and second interlayer lenses 208 and 209.

According to Japanese Patent Laid-Open No. 11-040787, in a photoelectric conversion device which has a charge transfer portion for transferring photoelectric converted charges and a transfer electrode provided above the charge transfer portion with an insulating film provided therebetween, a structure has been disclosed in which upward convex-shaped interlayer lenses are formed on a planarizing film.

However, according to the manufacturing method depicted in FIG. 11, a curved surface formed in the insulating film that forms the interlayer lenses is limited to having "peaks" above constituent elements of the pattern (e.g., 203) and "valleys" therebetween. Thus, the shape of the interlayer lens depends on the shape of the pattern and is also limited thereby. Accordingly, depending on the shape of the patterns, an interlayer lens having a desired light condensation efficiency may not be formed in some cases.

In addition, when interlayer lenses formed of a plurality of layers are combined with each other in order to improve the light condensation efficiency, the probability of light reflection occurring at the interface formed between layers having different refractive indexes increases as the number of layers forming the interlayer lenses is increased. Also, when the number of interfaces causing light reflection is increased, the number of light reflections increases accordingly. Hence, the amount of light incident on the light-receiving surface of the photoelectric conversion element is decreased, and as a result, the sensitivity of the photoelectric conversion device may be substantially decreased. In addition, in a structure having a monolayer wire, for example, as disclosed in Japanese Patent Laid-Open No. 11-040787, it is relatively easy to make the optical path length from the lens to the light-receiving portion small; however, in a photoelectric conversion device having a plurality of wire layers, the optical path length to the light-receiving portion tends to be increased, and hence the technical problem described above must be overcome.

SUMMARY OF THE INVENTION

Accordingly, an object of the present invention is to provide a photoelectric conversion device and a manufacturing method thereof, the photoelectric conversion device having interlayer lenses and being capable of improving the light condensation efficiency without substantially decreasing the sensitivity.

To achieve the object described above, in accordance with one aspect of the present invention, there is provided a photoelectric conversion device having a plurality of layers, which device comprises a photoelectric conversion element layer having a plurality of photoelectric conversion elements; a first wire layer provided above the photoelectric conversion element layer and having a first wire pattern; a second wire layer provided above the first wire layer and having a second wire pattern; and a lens layer positioned within the layers of the photoelectric conversion device and having a plurality of convex-shaped interlayer lenses positioned in optical paths above the photoelectric conversion elements, peaks of the interlayer lenses projecting in a direction away from the photoelectric conversion element layer.

Since the upward convex-shaped interlayer lens may be formed to have a desired convex shape regardless of the shapes of an insulating film and/or a pattern formed thereunder, by appropriately setting the curvature, thickness, and the like of the convex shape of the interlayer lens, the light condensation efficiency of the interlayer lens can be improved, and in particular, the structure described above may be effectively applied to a photoelectric conversion device having a plurality of wire layers.

In addition, in accordance with another aspect of the present invention, there is provided a method for manufacturing a photoelectric conversion device, which comprises: forming a first wire layer above a photoelectric conversion element layer having a plurality of photoelectric conversion elements, the first wire layer having a first wire pattern; forming a second wire layer above the first wire layer, the second wire layer having a second wire pattern; and forming a plurality of convex-shaped interlayer lenses on the second wire layer, peaks of the interlayer lenses projecting in a direction away from the photoelectric conversion elemeal layer.

According to the method for manufacturing a photoelectric conversion device, of the present invention, a photoelectric conversion device can be manufactured having interlayer lenses which can improve the light condensation efficiency without substantially decreasing the sensitivity.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Next, the embodiments of the present invention will be described with reference to drawings.

First Embodiment

Figure 1:
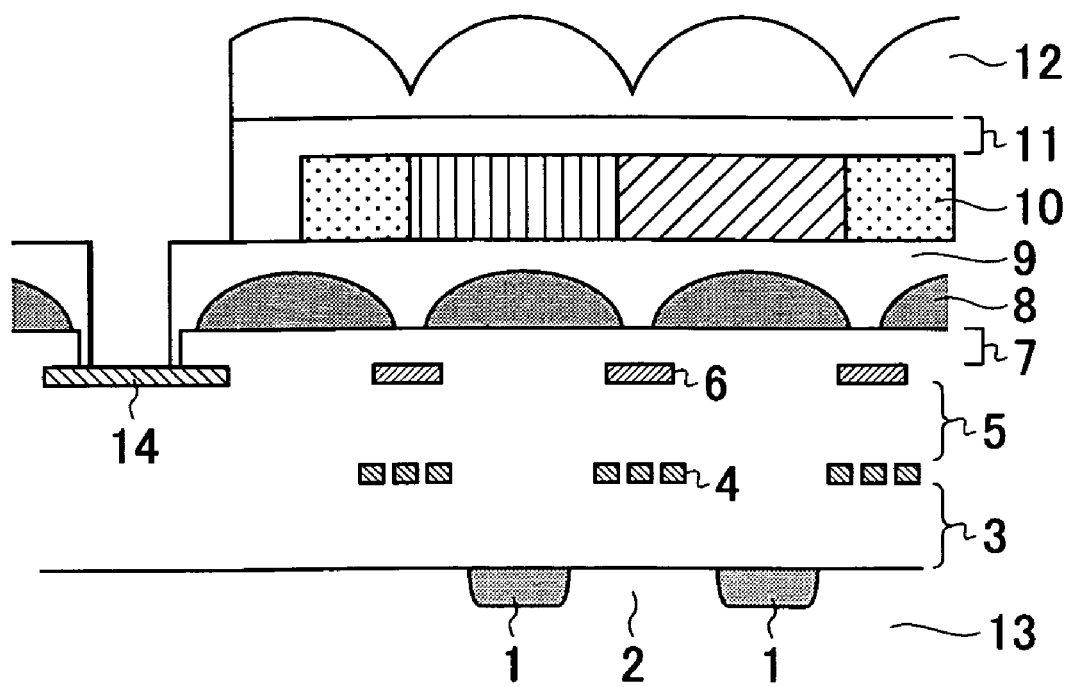
FIG. 1 is a schematic cross-sectional view of a photoelectric conversion device of a first embodiment according to the present invention.

FIG. 1 is a schematic cross-sectional view of a photoelectric conversion device of a first embodiment according to the present invention.

As shown in FIG. 1, in the photoelectric conversion device of this embodiment, photoelectric conversion elements 1 are formed along a surface of a semiconductor member 13, and an element isolation region 2 is provided between adjacent photoelectric conversion elements 1. In addition, on the semiconductor member 13, a first insulating film 3 is provided. On the first insulating film 3, a first pattern 4 provided above the element isolation region 2, a second insulating film 5 covering the first pattern 4, a second pattern 6 provided above the element isolation region 2 and the first pattern 4, and a third insulating film 7 covering the second pattern 6 are formed in that order. In addition, on the third insulating film 7, upward convex-shaped interlayer lenses 8 are formed, the peak of each upward convex shape projecting in the direction from the photoelectric conversion element 1 to a corresponding microlens 12 described later (the peak of the convex shape is in the direction toward incident light). The interlayer lenses 8 are arranged above the respective photoelectric conversion elements 1 (in other words, above areas between constituent elements forming the first pattern 4 and areas between constituent elements forming the pattern 6).

Furthermore, a first planarizing film 9 is provided on the interlayer lenses 8; on this planarizing film 9, a color filter layer 10 is provided which includes color filters having colors disposed above the respective photoelectric conversion elements 1; a second planarizing film 11 is provided on the color filter layer 10; and on the second planarizing film 11, the microlenses 12 are provided. The microlenses 12 are arranged above the respective photoelectric conversion elements 1.

The photoelectric conversion element 1 is formed of a photodiode or a phototransistor, which has a PN junction or a PIN junction, and a structure is formed in which light is incident on the depletion layer formed by the semiconductor junction as mentioned above and photoelectric conversion occurs in the depletion layer.

The element isolation region 2 is formed of a field oxide film by selective oxidation and is provided in a diffusion layer for junction isolation. The semiconductor member 13 provided with the photoelectric conversion elements 1 and the element isolation region 2 is, for example, a silicon substrate.

The first and the second patterns 4 and 6 function as wires for transmitting electrical signals from the photoelectric conversion elements 1. In addition, the patterns 4 and 6 are preferably formed of a conductive material such as a semiconductor or a metal which shades light in a wavelength region to which the photoelectric conversion element has sensitivity. In the case described above, the patterns 4 and 6 may function as light shielding members for preventing light from being incident on more than one photoelectric conversion element 1.

In addition, in the photoelectric conversion device, a pad portion 14 functions as a terminal (to be connected to an exterior circuit such as a power source) to which an electrode is connected. Above the area in which the pad portion 14 is formed, there is an opening in the interlayer lens, the color filter, and the microlens. However, initially, in the area outside of the pad portion 14, it is preferable that patterns of at least the interlayer lenses and the color filters be formed, in order to help stabilize the etching step performed to form the opening above the pad. The opening penetrates a part of the third insulating film 7, a part of the first planarizing film 9, and a part of the second planarizing film 11 and is formed by a photolithographic and an etching technique.

Light transmitting materials may be used for the first, second, and third insulating films 3, 5, and 7, so that light is absorbed in the photoelectric conversion element 1 and is then converted into an electrical signal. In addition, at least the third insulating film 7 is preferably treated by a planarizing process such as chemical mechanical polishing (hereinafter referred to as "CMP").

As described above, in the photoelectric conversion device of this embodiment, the upward convex-shaped interlayer lenses 8 are provided on the third insulating film 7 formed above the first and the second patterns 4 and 6. In this structure, unlike the techniques described in the Background of the Invention, the convex shape of the interlayer lens 8 does not depend on the shape of the second pattern 6 provided thereunder. Accordingly, the curvature, the thickness, and the like of the interlayer lens 8 may be designed to improve the light condensation efficiency of the interlayer lens 8.

Furthermore, the photoelectric conversion device of this embodiment does not employ interlayer lenses formed of a plurality of layers that are combined with each other. Rather, the interlayer lenses are formed of a single layer to have specific diameters and curvatures. Accordingly, the structure is formed so that the light condensation efficiency of the interlayer lens 8 is improved. Hence, as compared to a structure in which interlayer lenses formed of a plurality of layers are combined with each other, the number of interfaces having different refractive indexes is decreased, and as a result, the probability of light reflection is decreased. Accordingly, the structure of this embodiment is preferably applied to a photoelectric conversion device in which a plurality of wire layers is present, and in which the optical path length is liable to be increased.

Next, manufacturing steps of the photoelectric conversion device of this embodiment shown in FIG. 1 will be described with reference to FIGS. 2A to 5B.

Figure 2A:
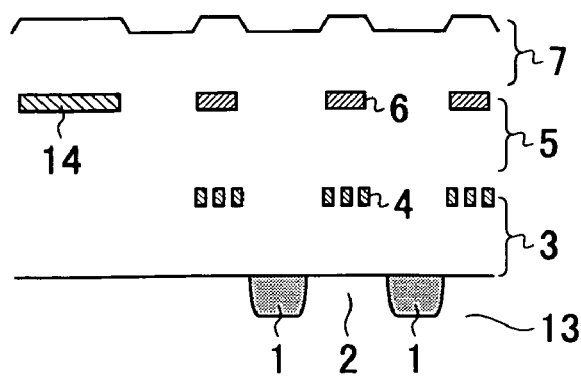
FIGS. 2A to 2C are schematic views showing manufacturing steps of the photoelectric conversion device of the first embodiment shown in FIG. 1.

First, as shown in FIG. 2A, the semiconductor member 13 made of a silicon wafer or the like is prepared, and the element isolation region 2 is formed along the surface of the semiconductor member 13 by a local oxidation of silicon (LOCOS) method or the like. Next, after a photoresist pattern is formed, by performing ion implantation and thermal treatment, for example, a diffusion layer used as a cathode or an anode of a photodiode (photoelectric conversion element 1) is formed along the surface of the semiconductor member 13.

Subsequently, by thermal oxidation, chemical vapor deposition (CVD), sputtering, coating, or the like, the first insulating film 3 is formed on the semiconductor member 13. In this step, when the surface of the first insulating film 3 is planarized by CMP or the like, the patterning accuracy in the following step can be improved.

Next, after a metal film composed of aluminum (Al), molybdenum (Mo), tungsten (W), tantalum (Ta), titanium (Ti), copper (Cu), or an alloy primarily composed thereof, is formed on the first insulating film 3 by sputtering, CVD, electrolytic plating, or the like, parts of the metal film located above the light-receiving surfaces of the photoelectric conversion elements 1 are removed by etching, thereby forming the first pattern 4 having a desired shape.

Next, the second insulating film 5 of SiO or a material primarily composed thereof is formed on the first insulating film 3 and the first pattern 4 by a CVD method. In this step, when the surface of the second insulating film 5 is planarized, the patterning accuracy in the following step can be improved.

Next, as with the first pattern 4, after a metal film composed of Al, Mo, W, Ta, Ti, Cu, or an alloy primarily composed thereof is formed on the second insulating film 5 by sputtering, CVD, electrolytic plating, or the like, parts of the metal film located above the light-receiving surfaces of the photoelectric conversion elements 1 are removed by etching, thereby forming the second pattern 6 having a desired shape and the pad portion 14.

In addition to functioning as wires transmitting electrical signals from the photoelectric conversion elements 1, the first and the second patterns 4 and 6 each function as a light shielding member for preventing light incident on one photoelectric conversion element 1 from being incident on another photoelectric conversion element 1. In addition, the second pattern 6 includes a light shielding member used for forming a light shielding region (optical black) outside of the effective pixel region, which light shielding region is used for forming the standard signal.

Next, the third insulating film 7 of SiO or a material primarily composed thereof is formed on the second insulating film 5 and the second pattern 6 by a CVD method.

Figure 2B:
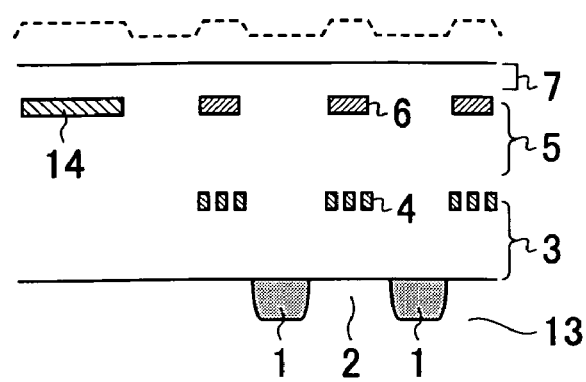

Subsequently, as shown in FIG. 2B, part of the surface of the third insulating film 7 is planarized by CMP.

Figure 2C:
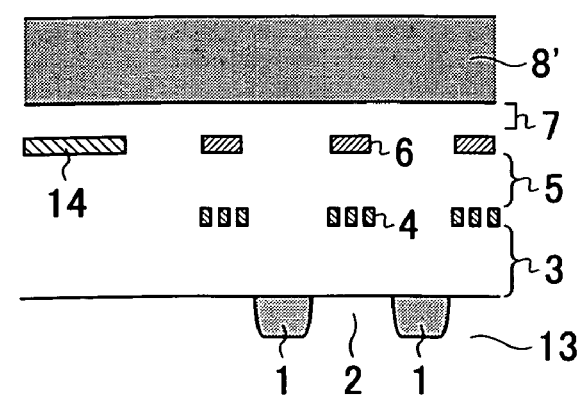

As shown in FIG. 2C, an interlayer lens forming film 8' made of SiN, SiON, SiO, or the like is then formed on the third insulating film 7 by a CVD method.

Figure 3A:
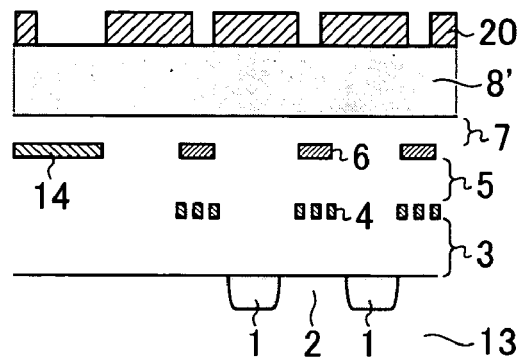
FIGS. 3A to 3C are schematic views showing manufacturing steps of the photoelectric conversion device of the first embodiment shown in FIG. 1.
Figure 3B:
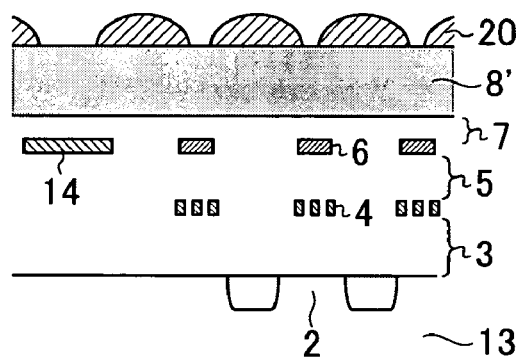

As shown in FIG. 3A, an etching mask 20 for forming the interlayer lenses 8 is formed on the interlayer lens forming film 8' in a photolithographic step. Subsequently, as shown in FIG. 3B, the etching mask 20 is reflowed by thermal treatment so that convex lens shapes each substantially equivalent to that of the interlayer lens 8 are formed. In this step, the interlayer lens is also formed to be outside the pad portion by virtue of an opening in the mask 20 above the pad portion 14.

Figure 3C:
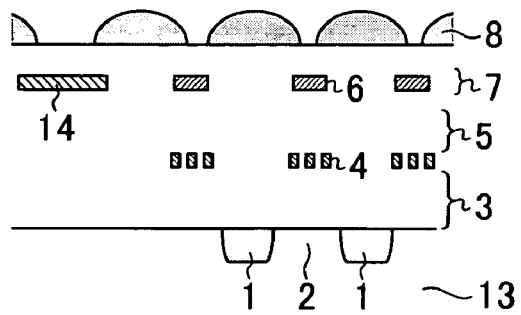

Next, as shown in FIG. 3C, gas etching is performed over the entire surface of the interlayer lens forming film 8' so that the convex shapes of the etching mask 20 are transferred to the interlayer lens forming film 8', thereby forming the interlayer lenses 8. The etching gas used in this step may be $CF_4$, $CHF_3$, $O_2$, Ar, He, or the like.

Figure 4A:
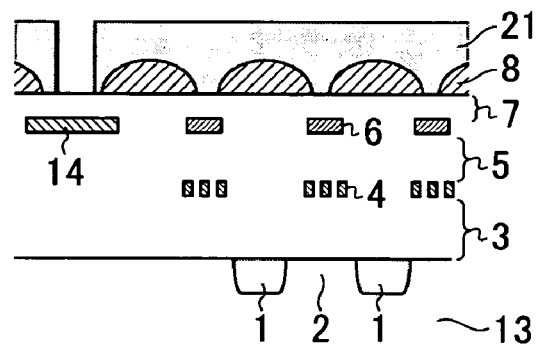
FIGS. 4A to 4C are schematic views showing manufacturing steps of the photoelectric conversion device of the first embodiment shown in FIG. 1.
Figure 4B:
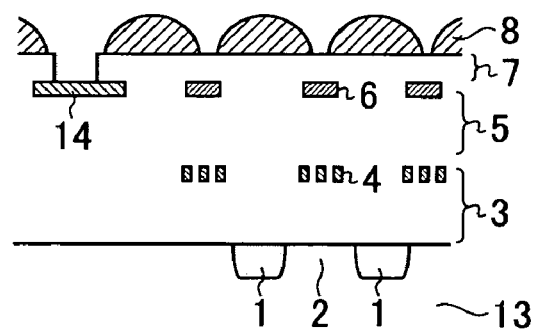

Subsequently, as shown in FIG. 4A, in order to form an opening in a part of the third insulating film 7 above the pad portion 14 by a lithographic technique, a resist pattern 21 having an opening pattern therefor is formed on the third insulating film 7 and the interlayer lenses 8, and as shown in FIG. 4B, the part of the third insulating film 7 located on the pad portion 14 is removed by a photolithographic technique.

Figure 4C:
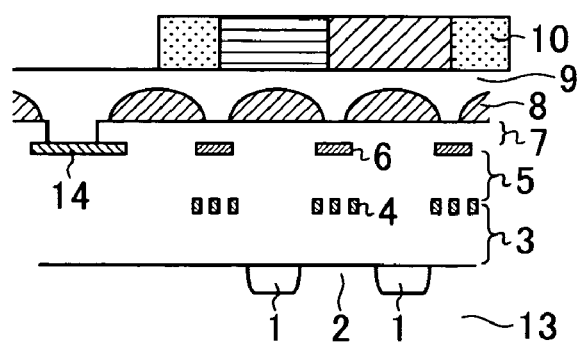

Next, as shown in FIG. 4C, the first planarizing film 9 is formed on the pad portion 14, the third insulating film 7, and the interlayer lenses 8, and on this first planarizing film 9, the color filter layer 10 is formed. The color filter layer 10 has a color pattern in conformity with colors of light incident on the individual photoelectric conversion elements 1 provided thereunder.

Figure 5A:
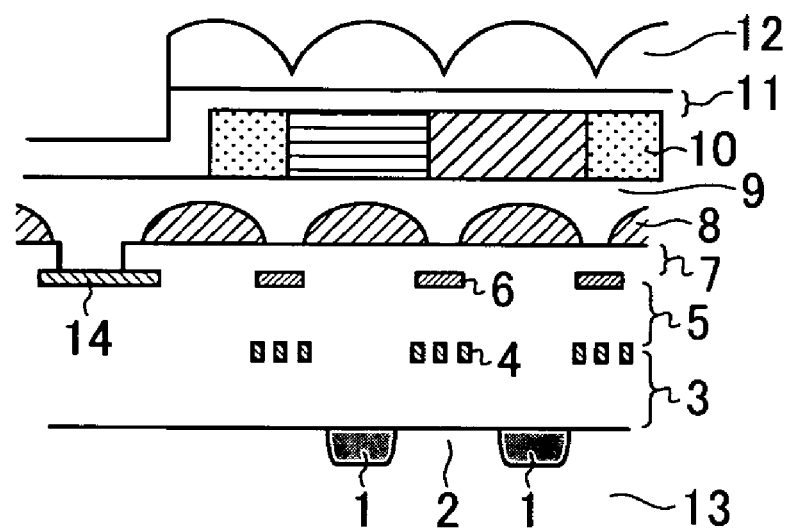
FIGS. 5A and 5B are schematic views showing manufacturing steps of the photoelectric conversion device of the first embodiment shown in FIG. 1.
Figure 5B:
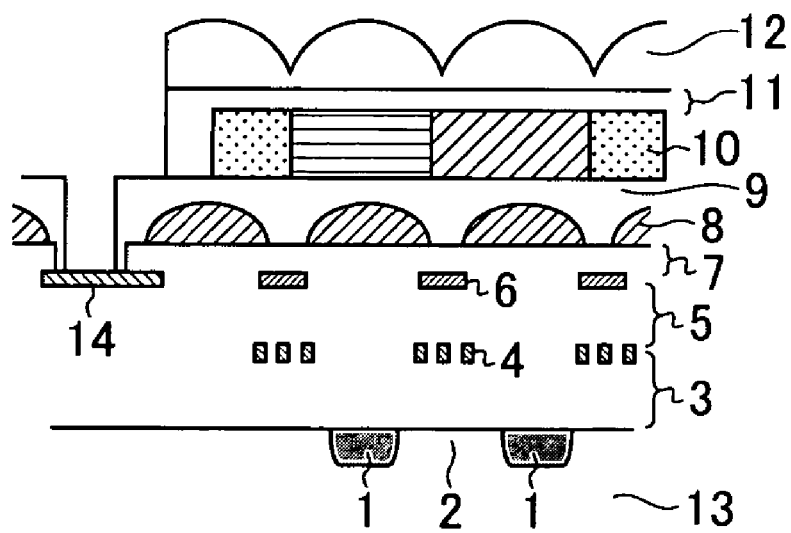

As shown in FIG. 5A, on the color filter layer 10, the microlenses 12 are then formed by resist patterning and reflow. Finally, as shown in FIG. 5B, parts of the first and the second planarizing films 9 and 11 remaining on the pad portion 14 are removed by etching, thereby forming the opening above the pad portion 14.

Accordingly, the manufacturing steps of the photoelectric conversion device are completed, and as a result, the photoelectric conversion device of this embodiment shown in FIG. 1 is formed. In this embodiment, the case in which two layers of the patterns (wire layers) are formed above the photoelectric conversion elements is described by way of example; however, the structure is not limited thereto. When the wire layer is further required, a third pattern may be provided between the first and the second pattern.

In this embodiment, in addition to the interlayer lenses, the structure in which the microlenses 12 (top lenses) are formed above the color filter layer 10 is also described. However, when the color mixture between adjacent pixels can be suppressed by decreasing the thickness of the color filter layer, and when the degree of the color mixture mentioned above is an acceptable level, the microlenses may be omitted.

Second Embodiment

Figure 6:
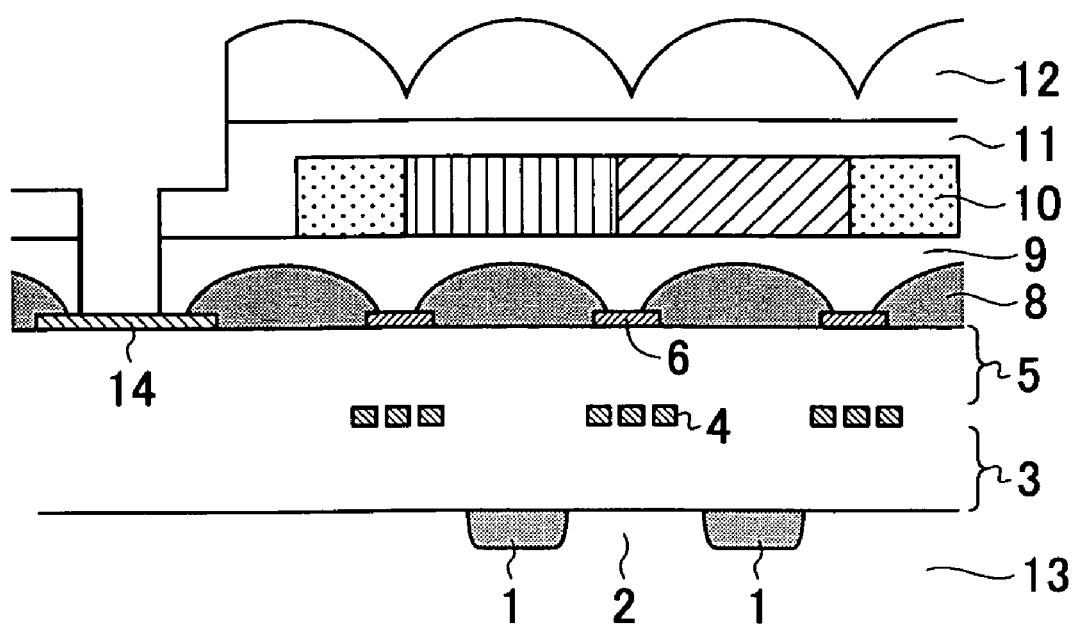
FIG. 6 is a schematic cross-sectional view of a photoelectric conversion device of a second embodiment according to the present invention.

FIG. 6 is a schematic cross-sectional view of a photoelectric conversion device according to a second embodiment of the present invention.

As shown in FIG. 6, in the photoelectric conversion device of this embodiment, the photoelectric conversion elements 1 are formed along a surface of the semiconductor member 13, and the element isolation region 2 is provided between adjacent photoelectric conversion elements 1. The first insulating film 3 is formed on the semiconductor member 13. On the first insulating film 3, the first pattern 4 disposed above the element isolation region 2, the second insulating film 5 covering the first pattern 4, and the second pattern 6 disposed above the element isolation region 2 and the first pattern 4 are formed in that order. In addition, on the second insulating film 5 and the second pattern 6, the upward convex-shaped interlayer lenses 8 are provided, the peak of each convex shape projecting in a direction from the photoelectric conversion element 1 to the corresponding microlens 12 described below. The interlayer lenses 8 are arranged above the respective photoelectric conversion elements 1 (in other words, above areas between constituent elements forming the first pattern 4 and areas between constituent elements forming the pattern 6).

Furthermore, the first planarizing film 9 is provided on the interlayer lenses 8 and the second pattern 6; on this planarizing film 9, the color filter layer 10 is provided which includes a color pattern in conformity with the individual photoelectric conversion elements 1; the second planarizing film 11 is provided on the color filter layer 10; and the microlenses 12 are provided on the second planarizing film 11. The microlenses 12 are arranged above the respective photoelectric conversion elements 1.

In the photoelectric conversion device of the first embodiment shown in FIG. 1, the third insulating film 7 is provided between the second pattern 6 and the interlayer lenses 8; however, in the photoelectric conversion device of this embodiment, the third insulating film 7 described above is not provided, and the interlayer lenses 8 are formed so as to be in contact with the second pattern 6.

The rest of the structure of the photoelectric conversion device of this embodiment is the same as that in the first embodiment, so detailed description thereof is omitted.

Referring again to FIG. 6, in the photoelectric conversion device of the second embodiment, the upward convex-shaped interlayer lenses 8 are formed on the second pattern 6 so as to be in contact therewith. Unlike previous techniques, the interlayer lens 8 can be formed into a desired shape regardless of the shape of the second pattern 6 thereunder. Hence, by specifically, setting the curvature, thickness, and the like of the interlayer lens 8, the light condensation efficiency thereof can be improved.

In addition, in the photoelectric conversion device of this embodiment, since the interlayer lenses are not formed of a plurality of layers combined with each other, and since the diameters and the curvatures of the interlayer lenses 8 formed of the same layer are specifically set as described above, the structure is formed in which the light condensation efficiency can be improved.

Furthermore, in the photoelectric conversion device of this embodiment, since the third insulating film 7 (see, e.g., FIG. 1) is not provided between the second pattern 6 and the interlayer lenses 8, and since the interlayer lenses 8 are formed so as to be in contact with the second pattern 6, the distance between the photoelectric conversion element 1 and the interlayer lens 8 is decreased by a length corresponding to the thickness of the third insulating film 7. Hence, the focal length of the interlayer lens 8 can be decreased. As a result, since the f-number of the interlayer lens 8 is decreased, the brightness is increased, and hence the sensitivity of the photoelectric conversion element 1 can be substantially further improved.

Next, a method for manufacturing the photoelectric conversion device of the second embodiment shown in FIG. 6 will be described with reference to FIGS. 7A to 9C.

Figure 7A:
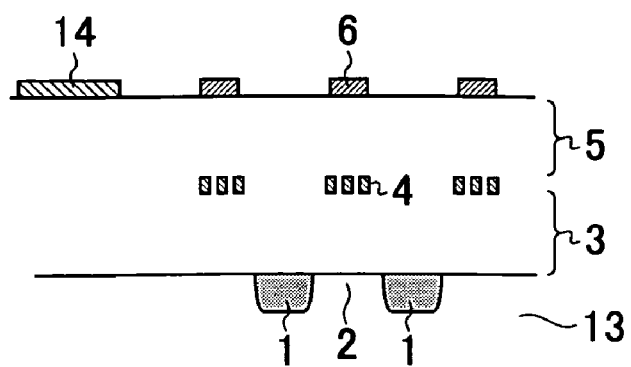
FIGS. 7A to 7C are schematic views showing manufacturing steps of the photoelectric conversion device of the second embodiment shown in FIG. 6.

First, as shown in FIG. 7A, the semiconductor member 13 made of a silicon wafer or the like is prepared, and the element isolation region 2 is formed along the surface of the semiconductor member 13 by a local oxidation of silicon (LOCOS) method or the like. Next, after a photoresist pattern is formed, by performing ion implantation and thermal treatment, for example, a diffusion layer used as a cathode or an anode of a photodiode (photoelectric conversion element 1) is formed along the surface of the semiconductor member 13.

Subsequently, by thermal oxidation, CVD, sputtering, coating, or the like, the first insulating film 3 is formed on the semiconductor member 13. In this step, when the surface of the first insulating film 3 is planarized by CMP or the like, the patterning accuracy in the following step can be improved.

Next, after a metal film composed of Al, Mo, W, Ta, Ti, Cu, or an alloy primarily composed thereof is formed on the first insulating film 3 by sputtering, CVD, electrolytic plating, or the like, parts of the metal film located above the light-receiving surfaces of the photoelectric conversion elements 1 are removed by etching, thereby forming the first pattern 4 having a desired shape.

Next, the second insulating film 5 of SiO or a material primarily composed thereof is formed on the first insulating film 3 and the first pattern 4 by a CVD method. In this step, when the surface of the second insulating film 5 is planarized, the patterning accuracy in the following step can be improved.

Next, as is the first pattern 4, after a metal film composed of Al, Mo, W, Ta, Ti, Cu, or an alloy primarily composed thereof is formed on the second insulating film 5 by sputtering, CVD, electrolytic plating, or the like, parts of the metal film located above the light-receiving surfaces of the photoelectric conversion elements 1 are removed by etching, thereby forming the second pattern 6 having a desired shape and the pad portion 14. In addition to functioning as wires transmitting electrical signals from the photoelectric conversion elements 1, the second pattern 6 also functions as a light shielding member for preventing light incident on one photoelectric conversion element 1 from being incident on another photoelectric conversion element 1. In addition, the second pattern 6 includes a light shielding member used for forming a light shielding region (optical black) outside of the effective pixel region, which light shielding region is used for forming the standard signal.

Figure 7B:
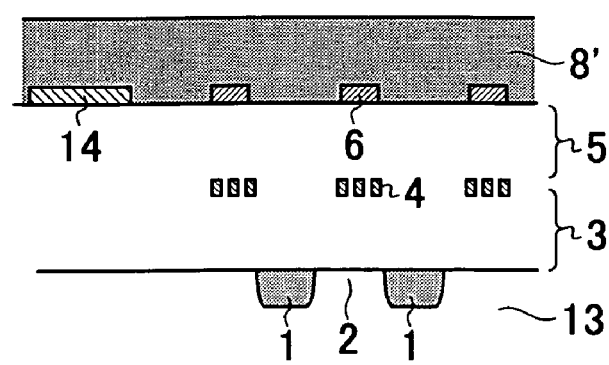

As shown in FIG. 7B, the interlayer lens forming film 8' made of SiN, SiON, SiO, or the like is then formed on the second insulating film 5 and the second pattern 6 by a CVD method.

Figure 7C:
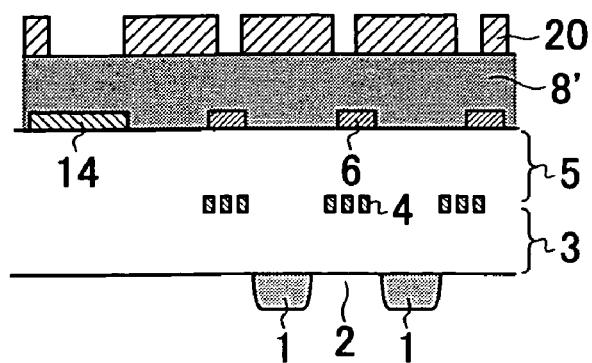

As shown in FIG. 7C, an etching mask 20 is formed on the interlayer lens forming film 8' by a photolithographic technique, the mask having an opening pattern for exposing the pad portion 14 in addition to the pattern for forming the interlayer lenses 8.

Figure 8A:
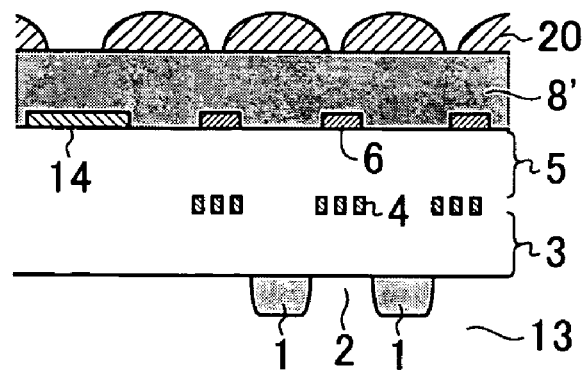
FIGS. 8A to 8C are schematic views showing manufacturing steps of the photoelectric conversion device of the second embodiment shown in FIG. 6.

Subsequently, as shown in FIG. 8A, the etching mask 20 is reflowed by thermal treatment so that convex lens shapes each substantially equivalent to that of the interlayer lens 8 are formed.

Figure 8B:
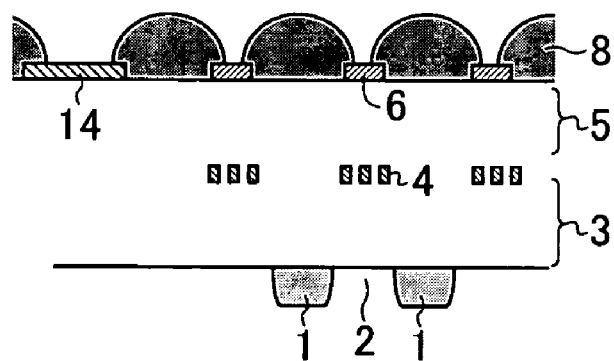

Next, gas etching is performed over the entire surface of the interlayer lens forming film 8' so that the convex shapes of the etching mask 20 are transferred to the interlayer lens forming film 8', thereby forming the interlayer lenses 8 as shown in FIG. 8B. In addition, at the same time, the upper surface of the pad portion 14 is exposed. The etching gas used in this step may be $CF_4$, $CHF_3$, $O_2$, Ar, He, or the like.

Figure 8C:
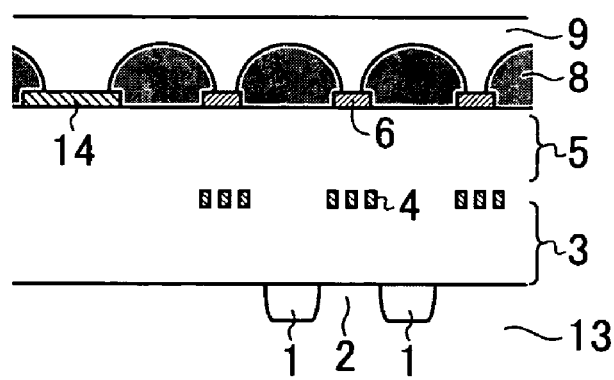

Next, as shown in FIG. 8C, the first planarizing film 9 is formed on the pad portion 14 and the interlayer lens 8.

Figure 9A:
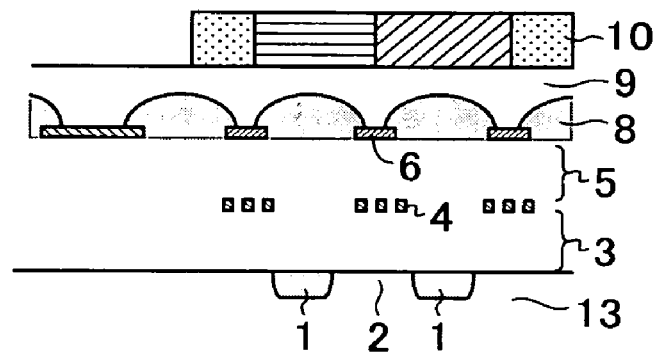
FIGS. 9A to 9C are schematic views showing manufacturing steps of the photoelectric conversion device of the second embodiment shown in FIG. 6.

Subsequently, as shown in FIG. 9A, on this first planarizing film 9, the color filter layer 10 is formed. The color filter layer 10 has a color pattern in conformity with colors of light incident on the individual photoelectric conversion elements 1 provided thereunder.

Figure 9B:
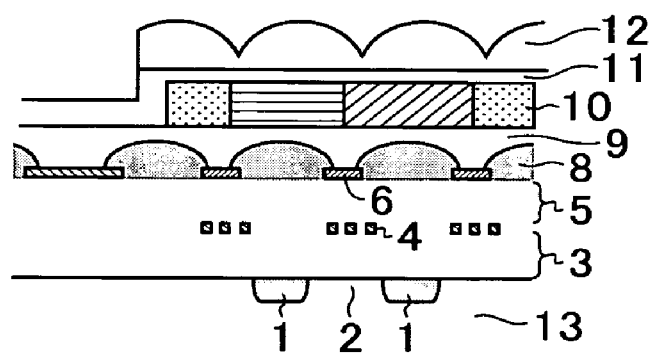
Figure 9C:
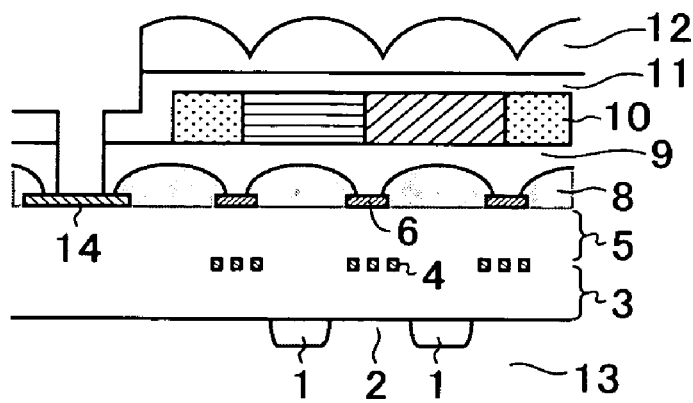
Figure 10A:
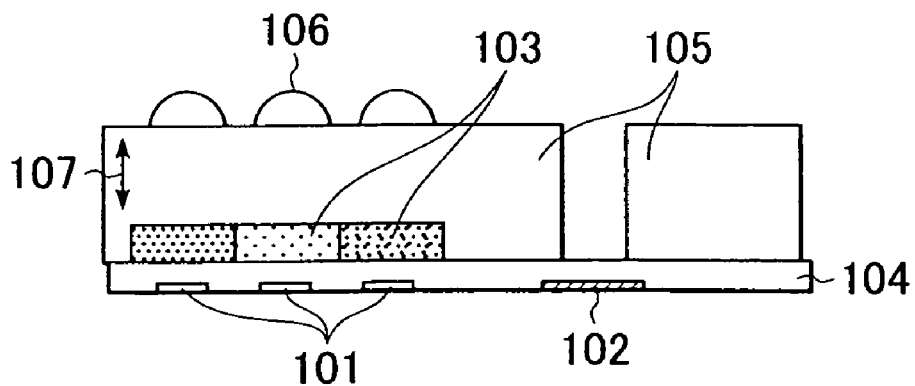
FIGS. 10A and 10B are schematic views showing manufacturing steps of a related solid-state image sensing device in which an on-chip lens is formed using an etch-back technique.
Figure 10B:
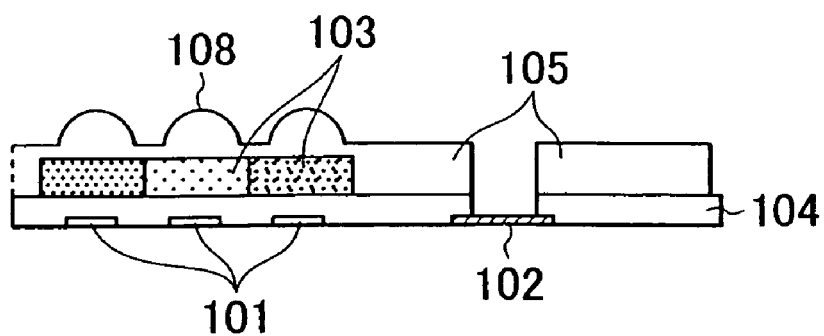
Figure 11:
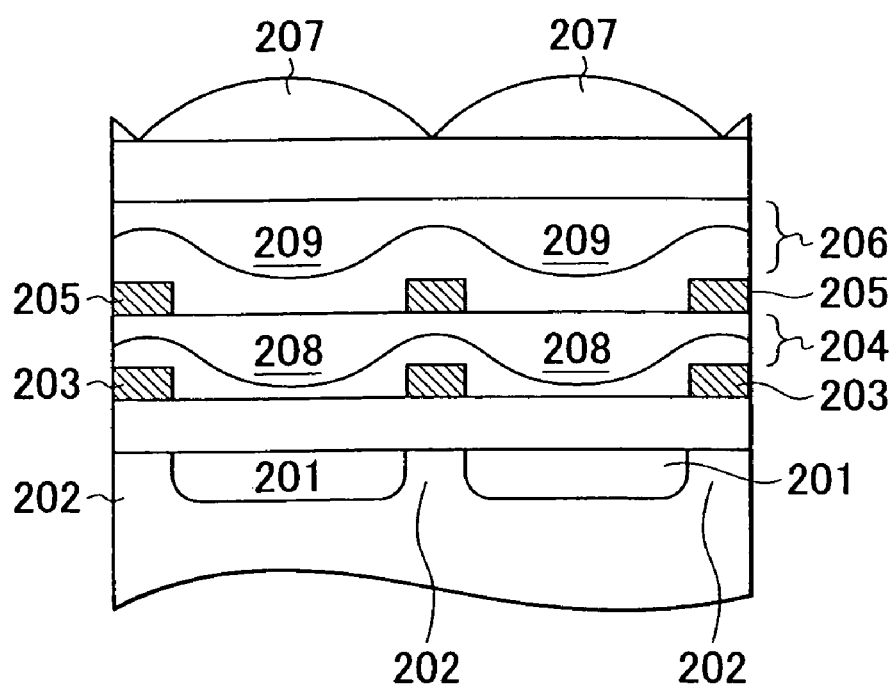
FIG. 11 is a cross-sectional view of a related photoelectric conversion device.

As shown in FIG. 9B, after the second planarizing film 11 is formed, above the color filter layer 10, the microlenses 12 are formed by resist patterning and reflow. Finally, as shown in FIG. 9C, parts of the first and the second planarizing films 9 and 11 remaining on the pad portion 14 are removed by etching, thereby forming the opening above the pad portion 14.

Accordingly, the manufacturing steps of the photoelectric conversion device are completed, and as a result, the photoelectric conversion device of this embodiment shown in FIG. 6 is formed.

In the manufacturing steps in this embodiment, as compared to the first embodiment, since the step of forming the third insulating film 7 and the step of forming the opening in the third insulating film 7 at a position above the pad portion 14 are omitted, the manufacturing process can be simplified in accordance with the number of steps thus omitted, and the time required for the manufacturing can be decreased.

Third Embodiment

Figure 12:
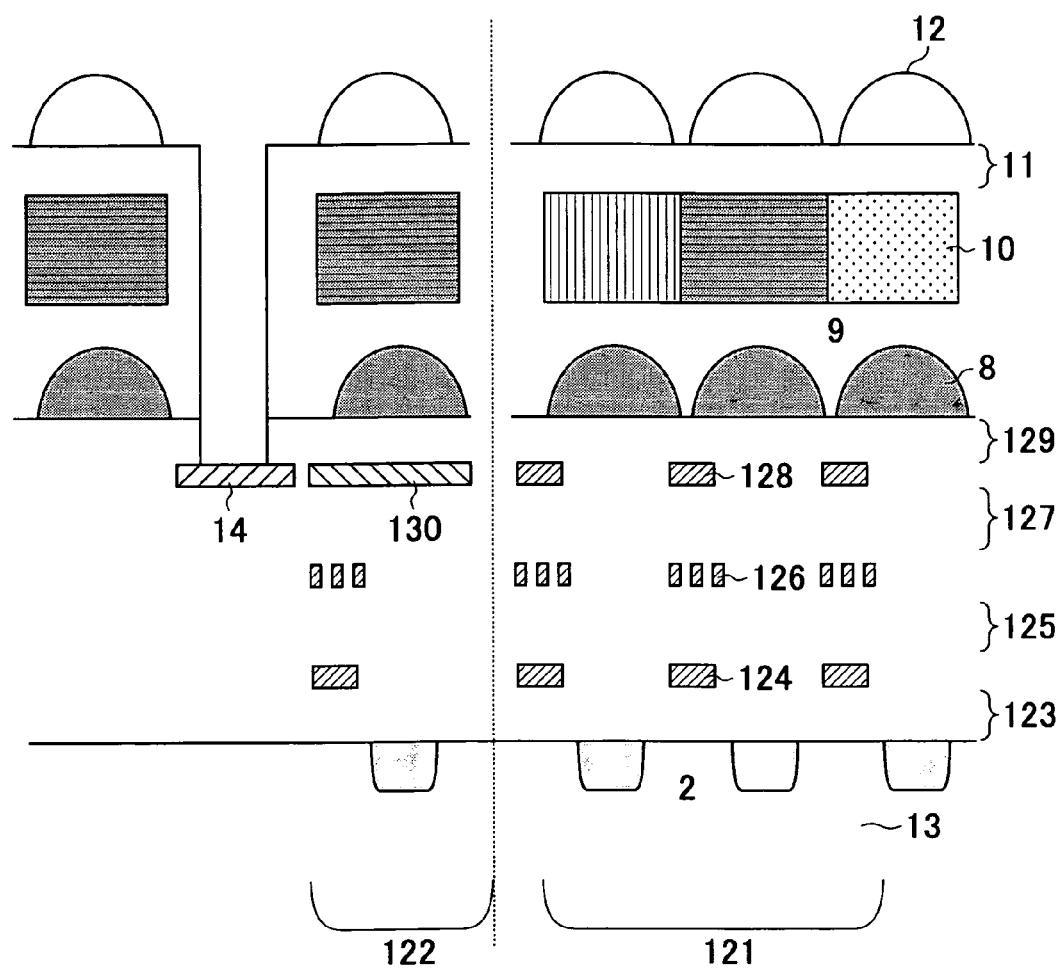
FIG. 12 is a schematic cross-sectional view of a photoelectric conversion device of a third embodiment according to the present invention.

FIG. 12 is a schematic cross-sectional view of a photoelectric conversion device according to a third embodiment of the present invention. In this figure, the same reference numerals as those in the first and the second embodiments designate constituent elements having the same functions, and detailed descriptions thereof will be omitted.

As shown in FIG. 12, in the photoelectric conversion device of this embodiment, three layers (first, second, and third patterns 124, 126, and 128) of patterns (wire layers) are formed above the photoelectric conversion elements, and on the photoelectric conversion elements, a first insulating layer 123, the first pattern 124, a second insulating layer 125, the second pattern 126, a third insulating layer 127, the third pattern 128, and a fourth insulating layer 129 are formed in that order. The surfaces of the individual insulating layers are preferably planarized by CMP or the like.

In the topmost wire layer 128, the pad portion 14 and a light shielding member 130 for forming a light shielding region 122 (optical black region) are included. In addition, outside the pad portion 14, for stabilizing an etching step, at least one film is initially provided forming at least one of the interlayer lenses 8, the color filter layer 10, and the microlenses 12. As a manufacturing method, the methods described in the first and the second embodiments may be used.

As for the thicknesses of the individual insulating films, it is preferable that the fourth insulating layer, that is, the insulating layer formed on the topmost wire layer have a thickness smaller than that of the other insulating layers. The thicknesses of the individual layers are preferably small in order to decrease the optical path length to the light-receiving portion; however, as for the insulating layers interposed between the wire layers, in order to decrease the parasitic capacitance generated between the wires, the insulating layer must have a thickness at a certain minimum thickness. On the other hand, the topmost insulating layer is only required to have flatness for the formation of interlayer lenses performed in a subsequent step. Accordingly, it is not necessary that the parasitic capacitance is taken into consideration, and in order to decrease the optical path length, the thickness of the topmost insulating layer is preferably small as compared to that of the other insulating layers. In particular, the thickness of the fourth insulating layer formed on the topmost wire layer is preferably 400 to 600 nm, and the thickness of the other insulating layers is preferably approximately 700 to 900 nm.

Fourth Embodiment

Figure 13:
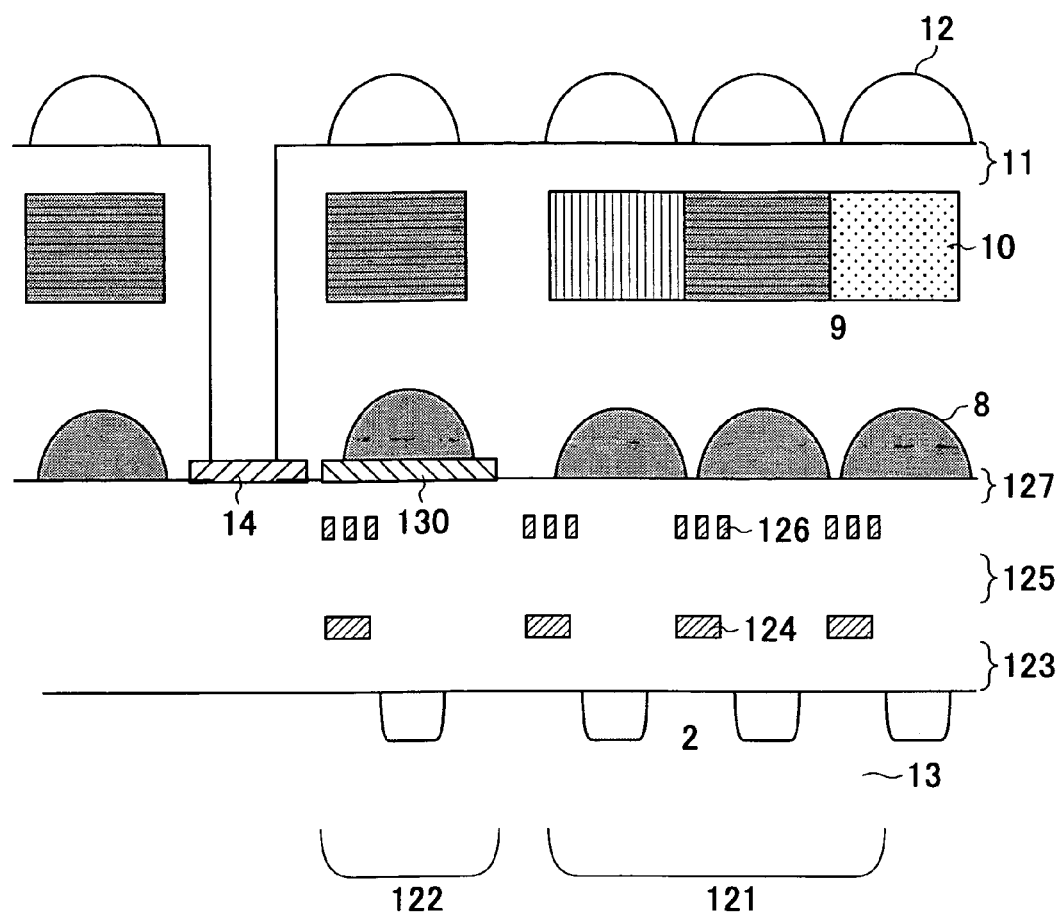
FIG. 13 is a schematic cross-sectional view of a photoelectric conversion device of a fourth embodiment according to the present invention.

FIG. 13 is a schematic cross-sectional view of a photoelectric conversion device according to a fourth embodiment of the present invention. In this figure, the same reference numerals as those in the first, second, and third embodiment designate constituent elements having the same functions, and detailed descriptions thereof will be omitted.

As shown in FIG. 13, in the photoelectric conversion device of this embodiment, in the topmost wire layer (i.e., on the third insulating layer 127), a wire pattern is not formed in the vicinity of the interlayer lenses in the effective pixel region, and instead only the pad portion 14 and the light shielding member 130 for the light shielding region are formed. This structure may be effective when the first and the second patterns are formed so that light incident between adjacent pixels is sufficiently suppressed. By the structure described above, as descried in the second embodiment, the upper surface of the pad portion 14 can be exposed at the same time the interlayer lenses are formed, and as a result, the manufacturing process can be simplified.

In this embodiment, three pattern layers are formed above the photoelectric conversion elements (including the light shielding region). The first insulating layer 123, the first pattern 124, the second insulating layer 125, the second pattern 126, and the third insulating layer 127 are formed in that order. Subsequently, after the third pattern including the light shielding member 130 and the pad portion 14 is formed, in the light shielding region 122, the interlayer lens 8 is formed on the third pattern without an insulating layer provided therebetween. Hence, in the light shielding region 122, the interlayer lens and the light shielding member are in direct contact with each other. The surfaces of the individual insulating layers are preferably planarized by CMP or the like.

In addition, it is preferable that the third insulating layer 127, that is, the insulating layer formed on the topmost wire layer in the effective pixel region have a thickness smaller than that of the other insulating layers. The thicknesses of the individual layers are preferably small in order to decrease the optical path length to the light-receiving portion; however, as for the insulating layer interposed between the wire layers, in order to decrease the parasitic capacitance generated between the wires, the insulating layer must have a certain minimum thickness. On the other hand, the topmost insulating layer is only required to have flatness for the formation of the interlayer lenses performed in a subsequent step. Accordingly, it is not necessary that the parasitic capacitance be taken into consideration, and in order to decrease the optical path length, the thickness of the topmost insulating layer is preferably small as compared to that of the other insulating layers. In particular, the thickness of the third insulating layer 127 formed on the topmost wire layer in the effective pixel region is preferably 400 to 600 nm, and the thickness of the other insulating layers is preferably approximately 700 to 900 nm.

Heretofore, the present invention has been described in detail. All structures that the present invention includes have not been disclosed; however, the individual embodiments may be optionally combined with each other.

In addition, as for the structure of the photoelectric conversion device, the present invention is preferably applied to an active pixel sensor (APS) structure in which an amplifying element for amplifying a signal charge is provided for each pixel or each unit formed of pixels. The reason for this is that the present invention is preferably used in the structure having a plurality of wire layers, and that this APS structure must have a plurality of wires as compared to the structure using CCDs.

In addition, in the embodiments described above, the structure has been described in which the microlenses 12 (top lenses) are formed above the color filter layer 10 in addition to the interlayer lenses 8. However, when the color mixture between adjacent pixels can be suppressed by decreasing the thickness of the color filter layer, and when the degree of the above color mixture is an acceptable level, the microlenses may be omitted.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A photoelectric conversion device having a plurality of layers, the device comprising:
    a photoelectric conversion element layer having a plurality of photoelectric conversion elements;
    a first wire layer provided above the photoelectric conversion element layer and having a first wire pattern;
    a second wire layer provided above the first wire layer and having a second wire pattern; and
    a lens layer positioned within the layers of the photoelectric conversion device and having a plurality of convex-shaped interlayer lenses positioned in optical paths above the photoelectric conversion elements, peaks of the interlayer lenses projecting in a direction away from the photoelectric conversion element layer,
    wherein the interlayer lenses are formed on the second wire layer so as to be in contact therewith.

2. A photoelectric conversion device having a plurality of layers, the device comprising:
    a photoelectric conversion element layer having a plurality of photoelectric conversion elements;
    a first wire layer provided above the photoelectric conversion element layer and having a first wire pattern;
    a second wire layer provided above the first wire layer and having a second wire pattern;
    a lens layer positioned within the layers of the photoelectric conversion device and having a plurality of convex-shaped interlayer lenses positioned in optical paths above the photoelectric conversion elements, peaks of the interlayer lenses projecting in a direction away from the photoelectric conversion element layer;
    a first insulating film covering the second wire layer, wherein the interlayer lenses are formed on the first insulating film; and
    a second insulating film covering the first wire layer, wherein a thickness of the second insulating film is greater than a thickness of the first insulating film.

3. The photoelectric conversion device according to claim 2, wherein the second wire layer comprises a light shielding member forming a light shielding region and a pad portion for connection to an exterior circuit.

4. The photoelectric conversion device according to claim 3, wherein the layer of interlayer lenses and the light shielding member are in contact in the light shielding region.

5. The photoelectric conversion device according to claim 2, wherein at least one of the interlayer lenses is formed outside an area above the pad portion.

6. The photoelectric conversion device according to claim 2, further comprising a layer of color filters formed above the interlayer lenses and a layer of microlenses formed above the color filters.

7. The photoelectric conversion device according to claim 6, wherein at least one of the layer of interlayer lenses, the layer of color filters, and the layer of microlenses is formed entirely outside an area above the pad portion.

8. The photoelectric conversion device according to claim 2, further comprising amplifying elements configured to amplify signals from the photoelectric conversion elements, wherein each of the amplifying elements corresponds to at least one of a plurality of pixels, each pixel containing one of the photoelectric conversion elements.

9. The photoelectric conversion device according to claim 2, further comprising a third wire layer positioned between the first wire layer and the second wire layer.

10. A method for manufacturing a photoelectric conversion device, comprising:

forming a first wire layer above a photoelectric conversion element layer having a plurality of photoelectric conversion elements, the first wire layer having a first wire pattern;

forming a second wire layer above the first wire layer, the second wire layer having a second wire pattern; and forming a plurality of convex-shaped interlayer lenses on the second wire layer, peaks of the interlayer lenses projecting in a direction away from the photoelectric conversion element layer, wherein the second wire layer comprises a pad portion to be connected to an exterior circuit, the method further comprising exposing an upper surface of the pad portion simultaneously with the step of forming a plurality of convex-shaped interlayer lenses.

* * * * *